(12) United States Patent
Adler et al.

(10) Patent No.: US 7,132,966 B2
(45) Date of Patent: Nov. 7, 2006

(54) FLOATING POINT IDAC

(75) Inventors: Andreas Adler, Schlierbach (DE);
Carlo Peschke, Kirchheim/Teck (DE)

(73) Assignee: Dialog Semiconductor GmbH,
Kirchheim/Teck-Nabern (DE)

( * ) Notice: Subject to any disclaimer, the term of this patent is extended or adjusted under 35 U.S.C. 154(b) by 0 days.

(21) Appl. No.: 10/990,004

(22) Filed: Nov. 16, 2004

(65) Prior Publication Data

US 2006/0103562 A1 May 18, 2006

(30) Foreign Application Priority Data

Nov. 12, 2004 (EP) .................................. 04392040

(51) Int. Cl.
*H03M 1/84* (2006.01)
(52) U.S. Cl. ..................... 341/138; 341/144
(58) Field of Classification Search ............... 341/138, 341/153, 135, 145, 154, 144
See application file for complete search history.

(56) References Cited

U.S. PATENT DOCUMENTS

| | | | | |
|---|---|---|---|---|
| 3,673,398 A | | 6/1972 | Loffbourrow ................ 235/154 |
| 4,240,070 A | | 12/1980 | Helbig et al. ......... 340/347 DA |
| 4,278,964 A | | 7/1981 | Vanderford .......... 340/347 DA |
| 4,393,369 A | | 7/1983 | Davies ................ 340/347 AD |
| 4,539,883 A | * | 9/1985 | Chihana ..................... 84/625 |
| 4,594,577 A | * | 6/1986 | Mao ........................... 341/135 |
| 4,672,875 A | * | 6/1987 | Suzuki ........................ 84/604 |
| 4,727,355 A | * | 2/1988 | Kohdaka et al. ............ 341/154 |
| 5,053,770 A | * | 10/1991 | Mayer et al. ................ 341/118 |
| 5,061,927 A | | 10/1991 | Linnenbrink et al. ........ 341/138 |
| 5,255,370 A | * | 10/1993 | Sako et al. ..................... 710/52 |
| 5,323,159 A | * | 6/1994 | Imamura et al. ............. 341/145 |
| 5,519,396 A | * | 5/1996 | Distinti ....................... 341/153 |
| 5,764,548 A | * | 6/1998 | Keith et al. .................. 708/204 |
| 6,388,388 B1 | * | 5/2002 | Weindorf et al. ......... 315/169.3 |
| 2003/0200244 A1 | * | 10/2003 | Abraham et al. | |
| 2004/0100475 A1 | * | 5/2004 | Leather | |
| 2004/0174286 A1 | * | 9/2004 | Donovan et al. | |

FOREIGN PATENT DOCUMENTS

JP          63 299516          12/1988

* cited by examiner

*Primary Examiner*—Jean Bruner Glaude
(74) *Attorney, Agent, or Firm*—Saile Ackerman LLC; Stephen B. Ackerman

(57) ABSTRACT

Circuits and methods to convert a digital floating-point number into an analog current have been achieved. The conversion is performed directly by using an exponential current digital-to-analog converter (DAC) and a cascaded linear current digital-to-analog converter (DAC). The exponential current DAC is converting exponentially the exponent of the floating-point number, its output current is biasing the linear DAC, which is converting the mantissa of the floating-point number. The output current of the linear current DAC is correlates linearly with the value of the floating-point number. This technique is commutative, this means the sequence of the linear and the exponential converter can be interchanged. In this case the linear converter provides a biasing current to the exponential converter. The sign bit can be considered by converting the direction of the output current of the converter. This floating-point number conversion can handle a very high dynamic range and requires a minimum of chip space.

41 Claims, 5 Drawing Sheets

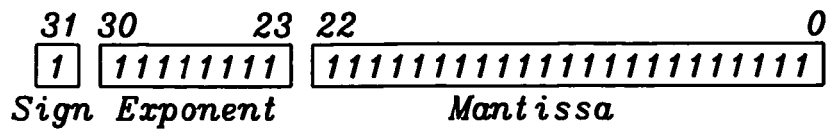
FIG. 1
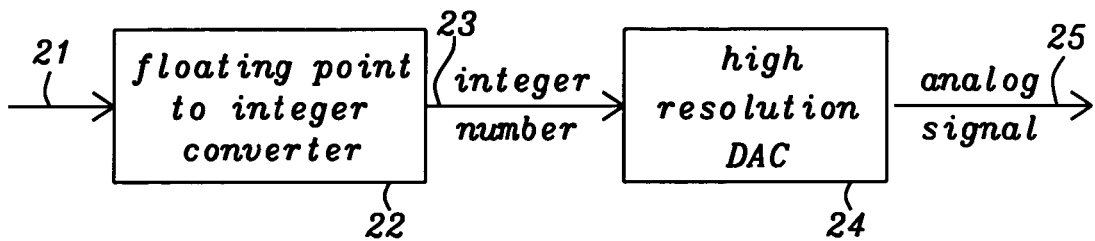
FIG. 2 - Prior Art
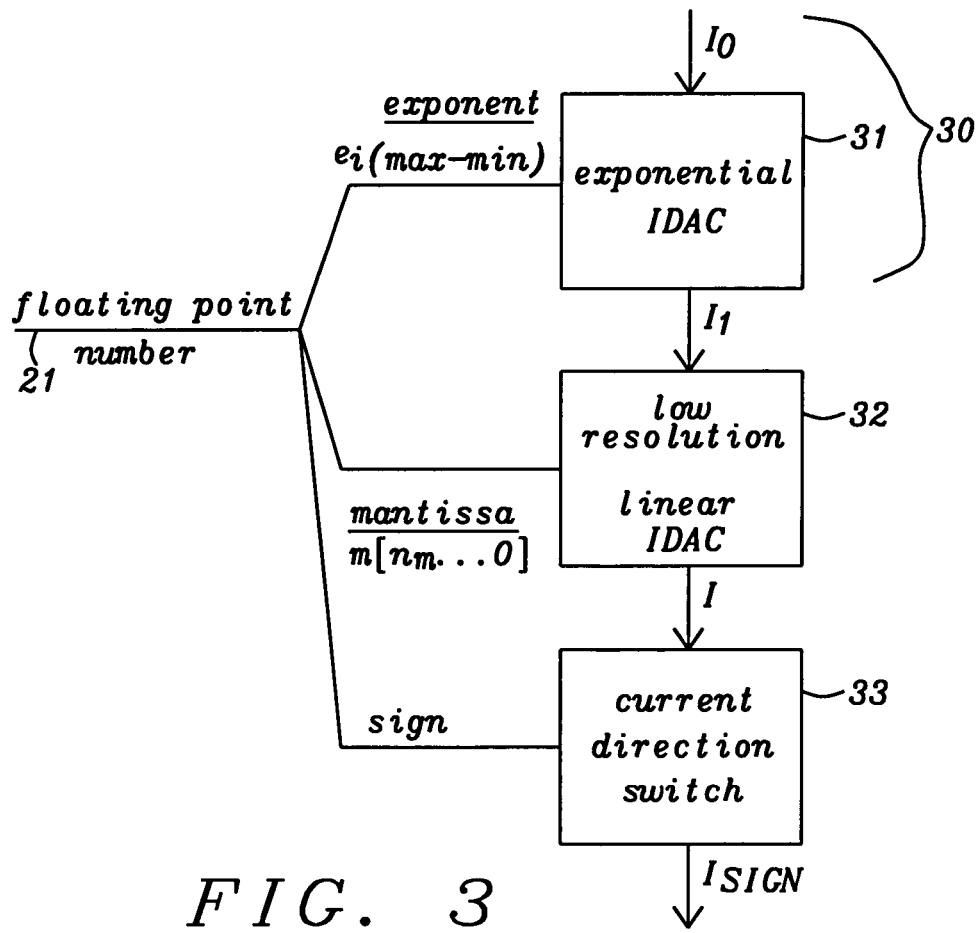
FIG. 3

FLOATING POINT IDAC

(1) FIELD OF THE INVENTION

This invention relates generally to digital-to-analog converters, and more particularly to a current digital-to-analog converter converting digital floating-point numbers directly into an analog signal.

(2) DESCRIPTION OF THE PRIOR ART

In conventional algebraic form a floating-point number is represented by:

$$F = \pm M \times B^E,$$

wherein F represents the absolute magnitude of the floating point number, M represents the mantissa portion of the number, B represents the base of the number system (B=10 in the decimal system), and E represents the exponent.

There are different floating-point storage formats known. One of the most common formats is the INTEL Short Real format, also called single precision format, which has being standardized by the IEEE organization. As example, the short real format, having 32 bits, is shown in FIG. 1. It has 1 bit for the sign, 8 bits for the exponent and 23 bits for the mantissa.

The sign of a binary floating-point number is represented by a single bit. A "1" indicates a negative number, and a "0" indicates a positive number.

An example is used to describe the representation of a mantissa. Using $-3.75 \times 10^4$ as an example, the sign is negative therefore the sign bit is ON. The mantissa in this example is 3.75 and the exponent is 4. The fractional portion of the mantissa is the sum of each digit multiplied with the power of 10:

$$.75 = \frac{7}{10} + \frac{5}{100}.$$

In regard to a binary floating-point representation of the example of the mantissa 3.75, the fractional portion of the mantissa is the sum of successive powers of 2.

$$.11 = \frac{1}{2} + \frac{1}{4}.$$

Combined with the left-hand side of the mantissa the binary floating number looks now 11.11, which is in decimal terms 3.75.

In IEEE Short Real format the exponents are stored as 8-bit unsigned integers with a bias of 127. The exponent is added to 127 and the sum is represented binary. Using the example shown above the exponent is 4. Added to 127 results in 131 and is represented by the string of 10000011.

Another common format for digital floating point numbers is the IEEE Long Real format, also called double precision, having 64 bits: 1 bit for the sign, 11 bits for the exponent and 52 bits for the mantissa.

Before storing a binary floating-point number its mantissa has to be normalized. The normalization is performed in a way that only one digit appears before the decimal. The exponent expresses the number of positions the decimal point was moved left.

FIG. 2 prior art shows a converter 20 converting a digital floating-point number 21 into an analog signal 25. In prior art a digital floating point to integer converter 22 and additionally a high resolution digital-to-analog converter 24 were required to convert a digital floating point number into an analog signal. The digital floating point to integer converter 22 converts the digital floating-point number 21 into a correspondent integer number 23. The high-resolution digital-to-analog converter 24 converts then in a second step this integer number 23 into an analog output signal 25.

It is a challenge for the designers of such solution to find less expensive converters to convert digital floating-point numbers into analog signals.

There are patents known describing the conversion of floating point numbers it analog signals.

U.S. Pat. No. 4,393,369 to Davies describes the digitizing of analog signals over a wide dynamic range for a floating-point decimal conversion. The widely fluctuating input analog voltages are converted to currents to prevent saturation of circuit elements and are, first, compared with a derived reference signal to produce positive voltages or negative voltages if the input signal exceeds or is less than the derived reference current. The positive and negative voltages are fed to a combined floating point processing unit and microprocessor, which generates two groups of digital signals. The first group is representative of m mantissa increments and the second group of n signals is indicative of the order of magnitude of the mantissa components. A mantissa digital-to-analog current generator and an order of magnitude digital-to-analog current generator are coupled in series with respect to each other to provide the derived reference current, which is to be compared with the next sample of the input analog signal. Since the derived reference current is derived in the immediately preceding sample period, the newly sampled analog signal is compared as being greater or lesser with a still newer input sample. The first group of digital signals indicative of the mantissa increments and the second group of digital signals indicative of the order of magnitude are fed onto following circuitry to allow for example, a visual readout or further processing. The floating-point analog-to-digital conversion has the great advantage over linear, analog arithmetic conversion by being able to handle large dynamic ranges of analog input signals.

U.S. Pat. No. 4,278,964 to Vanderford discloses a methodology and apparatus for converting wide dynamic amplitude range digital data recorded in floating point digital word form, comprising a binary coded mantissa and a binary coded exponent, to an analog signal, or oscillogram, of selectively compressed and/or amplified dynamic amplitude range. The digital word, occupying a number of binary bit positions, is, in algebraic form, $.+-.AG.sup.E$; where A represents the mantissa, or argument, G represents the base, or radix, of the number system used and E represents the exponent. Since the base G is constant, for example at 8, the only binary bits that need to be recorded are those representing the mantissa A and the exponent E. In reconverting the digital data to analog form for making an oscillogram, or wiggle trace, it is desired to selectively amplify and/or compress the dynamic range and, yet, at the same time avoid introducing serious distortion. The methodology employed to accomplish such reconversion is to change either, or both, the mantissa A and base, or radix, G in such a way that the dynamic range is compressed and, yet, any distortion thereby introduced is minimal. Apparatus for performing the aforesaid changes, among other things, is disclosed.

U.S. Pat. No. 4,240,070 to Helbig et al. teaches an apparatus and method providing for an improvement to a system which converts wide amplitude range digital data recorded in floating point digital word form to analog signals within a limited amplitude range. The apparatus and method provides for the situation wherein the digital data can represent an analog signal for which on a general decrease in amplitude increases may be superimposed. The apparatus includes a digital/analog converter whose reference voltage is individually determined for each sample. This reference voltage is taken from a saw tooth oscillator at an instant of time determined by a delay timer, which responds to changes, with respect to a desired average amplitude, of the actual amplitude of the converted data.

SUMMARY OF THE INVENTION

A principal object of the present invention is to achieve a method to convert directly a digital floating-point number to an analog current.

Another principal object of the present invention is to achieve a circuit to convert a digital floating-point number directly to an analog current having a high dynamic range and requiring a minimum of chip space.

In accordance with the objects of this invention a method to convert a digital floating-point number directly into an analog signal has been achieved. The method invented comprises, first, to provide a linear current digital-to-analog converter cascaded with an exponential current digital-to-analog converter. The next steps of the method invented are to split a floating-point number into its mantissa and exponent, to convert said exponent to a current representing an analog signal of the exponent using said exponential current digital-to-analog converter, and to convert said digital floating point number into an analog current by converting said mantissa by said linear current digital-to-analog converter using the output current of the previous step as biasing reference current. Additionally, if required, the sign bit of the floating-point number can define the direction of the output current via a current direction switch block.

In accordance with the objects of the invention an alternative method to convert a digital floating point number directly into an analog signal has been achieved. This method invented comprises, first, to provide an exponential current digital-to-analog converter cascaded with a linear current digital-to-analog converter. The following steps of this method are to split a floating-point number into its mantissa and exponent, to convert said mantissa to a current representing an analog signal of the mantissa using said linear current digital-to-analog converter, and convert said digital floating point number into an analog current by converting said exponent by said exponential current digital-to-analog converter using the output current of the previous step as biasing reference current.

In accordance with the objects of this invention a circuit to convert digital floating-point numbers into an analog current signal has been achieved. This circuit invented comprises, first, an exponential current digital-to-analog converter, having an input and an output, wherein the input is a vector comprising the bits of the exponent of said floating-point number and the output is an analog current being correlated to the exponential value of said exponent. Secondly the converter comprises a linear current digital-to-analog converter having inputs and an output, wherein the inputs comprise a vector comprising the mantissa of said floating point number and said analog output current of said exponential current digital-to-analog converter and the output comprises an analog current being linearly correlated to the value of said digital floating point number.

In accordance with the objects of this invention an alternative circuit to convert digital floating point numbers into an analog current signal has been achieved. This alternative circuit comprises, first, a linear current digital-to-analog converter, having an input and an output, wherein the input is a vector comprising the bits of the mantissa of said floating point number and the output is an analog current being correlated to the linear value of said mantissa. Furthermore this alternative circuit comprises an exponential current digital-to analog converter having inputs and an output, wherein the inputs comprise a vector describing the exponent of said floating-point number and said analog output current of said linear current digital-to-analog converter and the output comprises an analog current being linearly correlated to the value of said digital floating point number, and, finally, a means to convert the direction of the output current dependent upon the sign of said floating-point number.

BRIEF DESCRIPTION OF THE DRAWINGS

In the accompanying drawings forming a material part of this description, there is shown:

FIG. 1 shows the structure of a floating-point number.

FIG. 2 prior art illustrates a block diagram of a prior art digital-to-analog converter of a floating-point number.

FIG. 3 illustrates a block diagram of the present invention of a digital-to-analog converter of floating-point numbers.

DESCRIPTION OF THE PREFERRED EMBODIMENTS

Figure 4A:
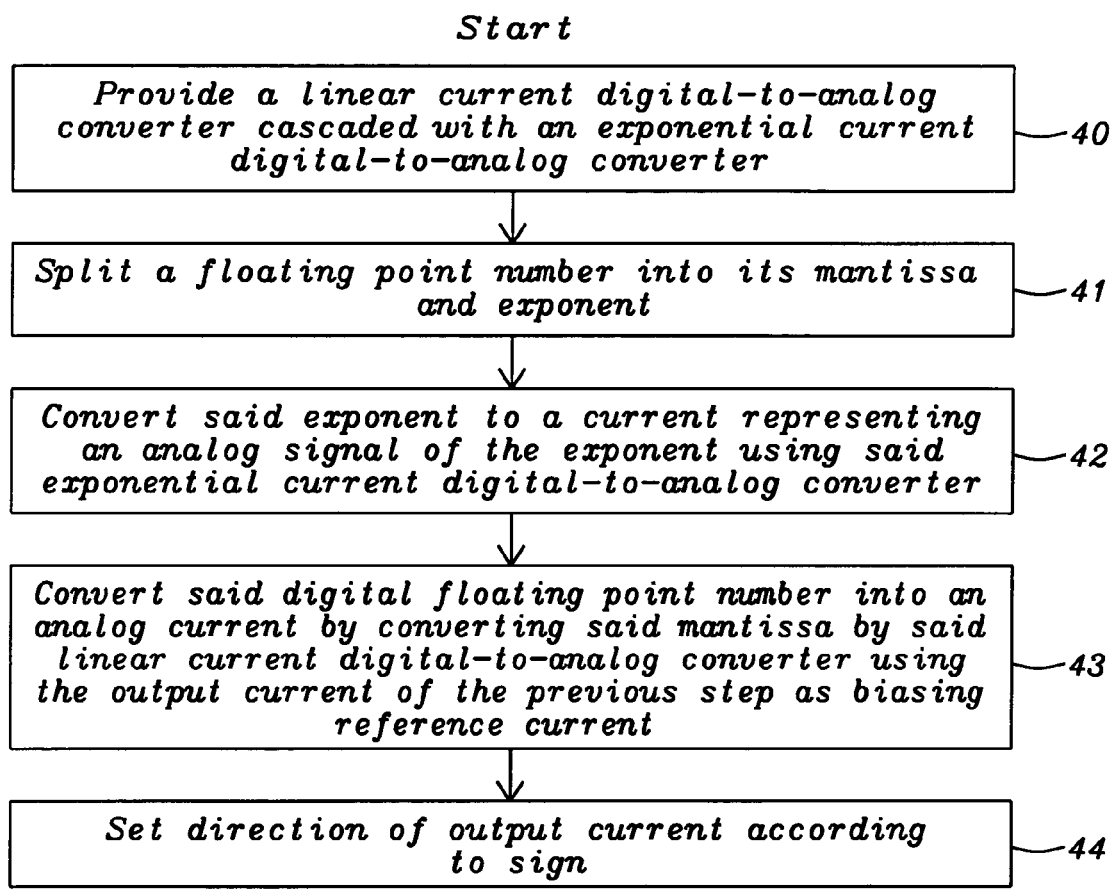
FIG. 4a shows a flowchart of the method invented to convert a digital floating-point number to an analog current.

The preferred embodiments of the present invention disclose novel methods and circuits for conversion of a floating-point number into a corresponding analog current.

FIG. 3 shows a principal block diagram of the converter 30 of the present invention. Instead of using a digital floating-point-to-integer converter and additionally a high resolution digital-to-analog converter as showed in FIG. 2 prior art the conversion of the present invention is performed directly using two cascaded current digital-to-analog converters (IDACs). A first IDAC 31 is converting the exponent of the incoming binary floating-point number 21 and a second low resolution linear IDAC 32 converts the mantissa of the incoming binary floating-point number 21. A biasing current $I_0$ is flowing into the exponential IDAC 31. The input signals of this exponential IDAC 31 are (max−min+1) bits from the exponent $e_i$ [max . . . min] of the incoming binary floating-point number 21 wherein i signifies the significant bits of the exponent ranging from the maximal (max) or most significant bit (MSB) at the left of the bit-string of the exponent to the minimum (min) or least significant bit (LSB) to the right of the exponent. Additionally, if required, the sign bit of the floating-point number 21 can define the direction of the output current via a current direction switch block 33.

The exponential IDAC converts the incoming exponent $e_i$ [max . . . min] into an output current $I_1$:

$$I_1 = I_0 \times \prod_{j=\min}^{\max} 2^{2^j e_j}, \quad (1)$$

wherein $I_1$ is the output current of the exponential IDAC 31, $I_0$ is the biasing current of the exponential converter, $e_j \in \{0, 1\}$ represent the significant bit positions of the exponent wherein i is ranging from the MSB bit, signified by "max" to the LSB bit, signified by "min". This means $e_j$ are components of a vector of (max−min+1) bits. The output current of the exponential IDAC 31 is the biasing reference current of the low resolution linear IDAC 32.

The low resolution linear IDAC 32 converts the mantissa of the incoming digital floating-point number 21 into binary values. Using the reference current $I_1$ from the exponential IDAC 31

$$I_1 = I_0 \times \prod_{j=\min}^{\max} 2^{2^j e_j}, \quad (2)$$

wherein $I_1$ represents the exponent of the incoming binary floating-point number 21. The low resolution linear IDAC 32 provides the mantissa values to the current $I_1$ and generates a current I representing an analog signal converted from the incoming binary floating-point number 21:

$$I = I_0 \times \prod_{j=\min}^{\max} 2^{2^j e_j} \times \sum_{i=0}^{n_m} 2^i m_i, \quad (3)$$

wherein $$I_0 \times \prod_{j=\min}^{\max} 2^{2^j e_j}$$

corresponds to the output current $I_1$ of the exponential IDAC 31, m represents the mantissa of the incoming digital floating point number 21, and $m_i \in \{0, 1\}$ represent the bit positions of the mantissa wherein i is ranging from zero position to the maximum $n_m$ position of the mantissa. This means $m_i$ are components of a vector of $n_m+1$ bits.

The output current I of the converter 30 of the present invention represents an analog output signal converted from an incoming digital floating-point number 21. According to the sign bit the current direction switch block 33 controls the direction of the output current I dependent upon the sign bit of the incoming floating point number; the output current is either sunk or sourced.

It has to be understood that the sequence of blocks 31 and 32 is commutative. This means that the sequence of blocks 31 and 32 can be interchanged in an alternative embodiment of the invention. In this case the conversion of the mantissa, performed by the linear IDAC of block 32 provides the biasing current for the exponential IDAC of block 31, performing the conversion of the exponent. The output of the exponential IDAC 31 can then be used for the current direction switch of block 33 according to the sign bit of the incoming floating point number.

One key advantage of the present invention is that a conversion from a floating-point number to an integer number prior to digital-to analog conversion is no more required. The cascaded digital-to-analog converter of the present invention has a high dynamic range and requires less chip area than prior art solutions.

FIG. 4a illustrates the method steps of a preferred embodiment of the present invention. Step 40 describes the provision of a linear current digital-to-analog converter cascaded with an exponential current digital-to-analog converter. In step 41 an incoming floating-point number is split into its mantissa and exponent. In step 42 said exponent of the incoming floating point number is converted to a current representing an analog signal of the exponent using said exponential current digital-to-analog converter and in step 43 said digital floating point number is converted into an analog current by converting said mantissa by said linear current digital-to-analog converter using the output current of the previous step as biasing reference current. If required the direction of the output current can be set in step 44 dependent upon the sign bit as described above. This can be advantageous for some applications.

Figure 4B:
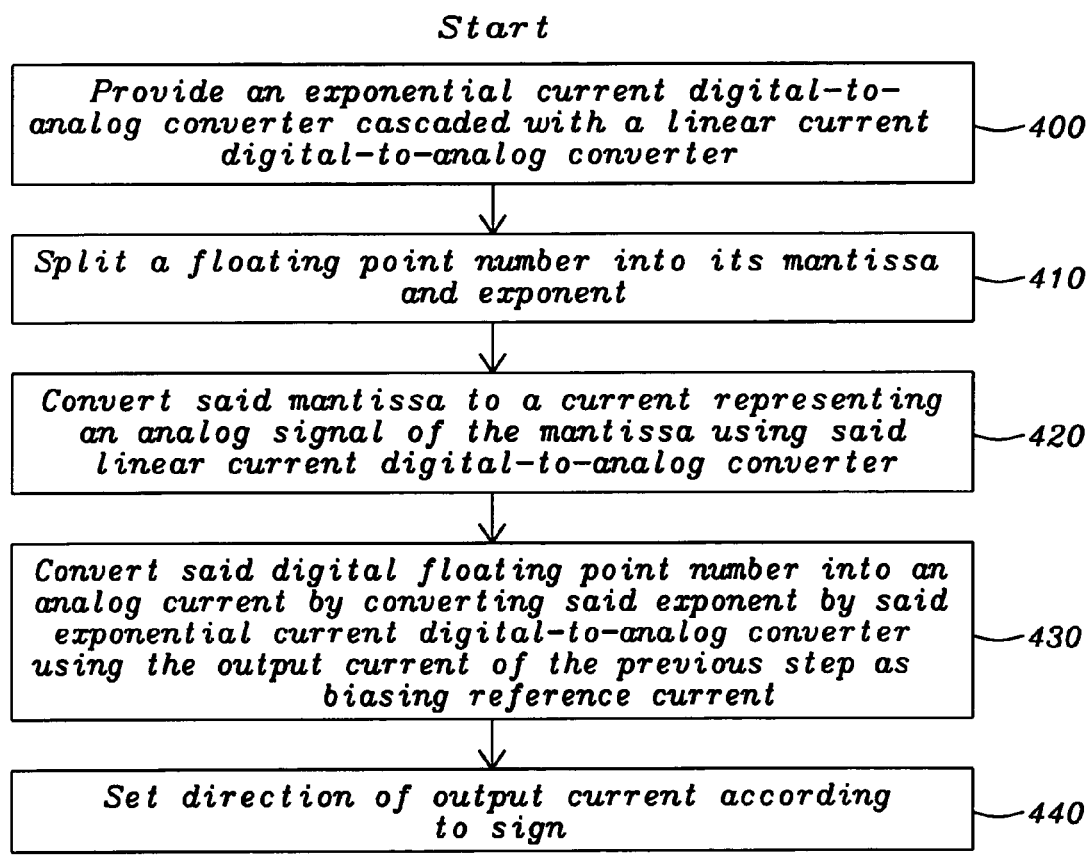
FIG. 4b shows a flowchart of an alternative method invented to convert a digital floating-point number to an analog current.

FIG. 4b illustrates the method steps of an alternative embodiment of the present invention. As described above, according to the commutative property of the present invention, the sequence of the linear and exponential conversion can be interchanged. In this alternative embodiment the output current of a linear IDAC is used as a biasing current of an exponential IDAC. Step 400 of FIG. 4b describes the provision of an exponential current digital-to-analog converter cascaded with a linear current digital-to-analog converter. In step 410 an incoming floating-point number is split into its mantissa and exponent. In step 420 said mantissa of the incoming floating point number is converted to a current representing an analog signal of the mantissa using said linear current digital-to-analog converter and in step 430 said digital floating point number is converted into an analog current by converting said exponent by said exponential current digital-to-analog converter using the output current of the previous step as biasing reference current. If required the direction of the output current can be set in step 440 dependent upon the sign bit as described above. This can be advantageous for some applications.

Figure 5:
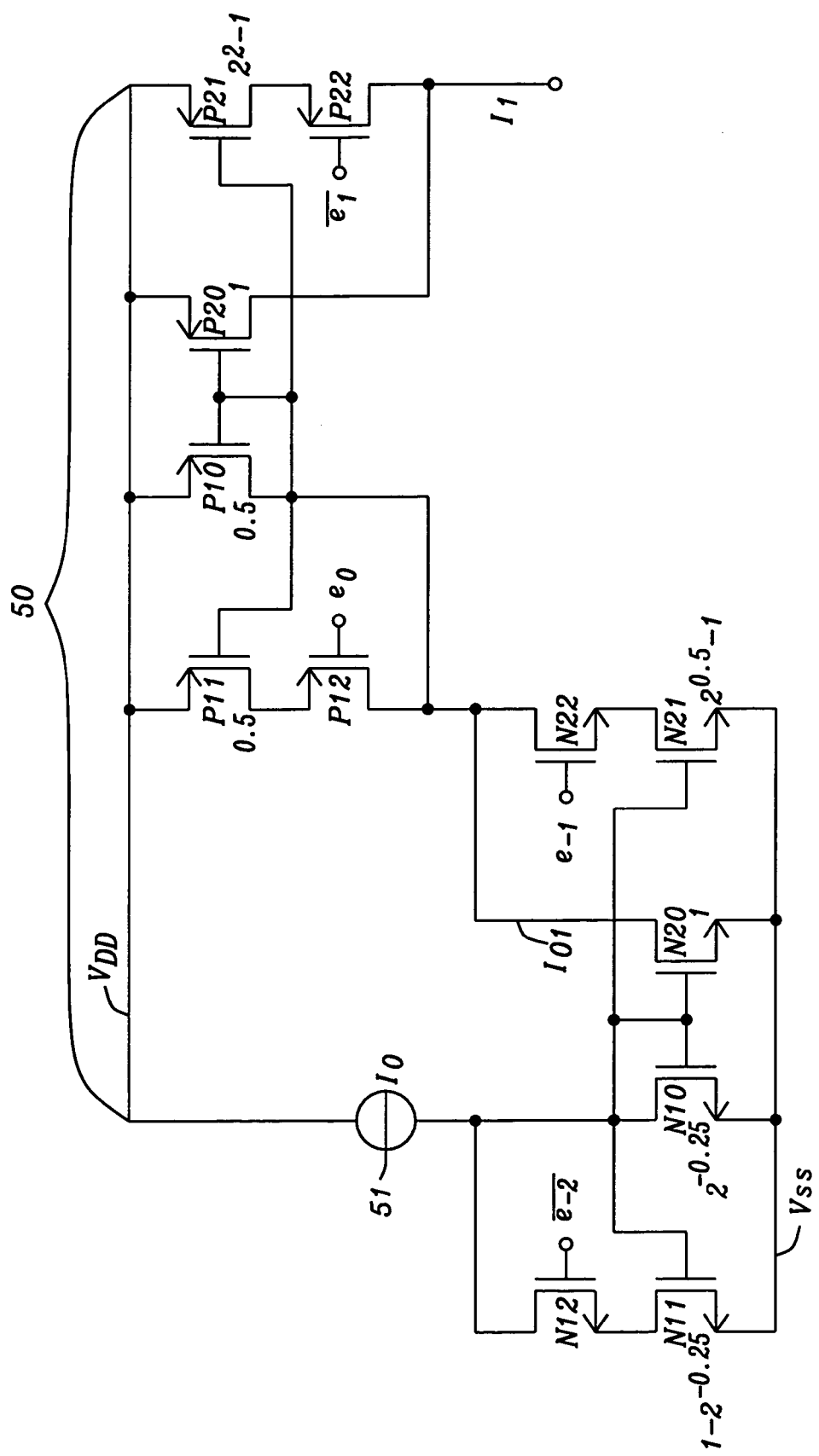
FIG. 5 illustrates a circuit diagram of a preferred embodiment of an exponential current digital-to-analog converter of the present invention.

FIG. 5 shows a schematic of the circuit of a preferred embodiment of a 4-bit exponential current digital-to analog converter 50. The converter 50 shown in FIG. 5 corresponds to the converter 30 as shown in FIG. 3 and is an important part of the present invention. It has to be understood that by cascading the circuit of FIG. 5 more bits could be exponentially converted to an analog current and vice versa less bits can be converted by omitting some stages.

The current source 51 provides the biasing current $I_0$ for the converter 50 according to $I_0$ of equation (1)

According to the block diagram of FIG. 3 the output current of the converter 50 shown in FIG. 5 is $I_1$.

The gate of transistor N12 is the inverted port of the LSB bit $e_{-2}$ of the exponent of the floating-point number to be converted. The gate of transistor N22 is the port of the bit $e_{-1}$, which is the second bit from the right of the exponent of the floating-point number to be converted. The gate of transistor P12 is the port of the bit $e_0$, which is the third bit from the right of the exponent of the floating-point number to be converted and the gate of transistor P22 is the inverted port of the MSB bit $e_{+1}$ of the exponent of the floating-point number to be converted. The indices of the four bits of the exponent range from a minimum value of −2 to a maximum value +1 in order to match with equation (1) shown above in case the four bits of the exponent is all zero.

The transistors N10 and N20 form a current mirror wherein N10 is the input transistor and N20 is the output transistor. Transistor N11 can be switched in parallel to transistor N10 by switching N12 ON by the LSB bit $e_{−2}$ of the exponent to be converted. Transistor N21 can be switched in parallel to transistor N20 by switching transistor N22 ON by the $e_{−1}$ bit of the exponent. Dependent upon the status of the bits $e_{−2}$ and $e_{−1}$ the transistors of the current mirror N10/N20 can be made wider and thus the related current mirror ratio can be changed.

The ratio $R_M$ of current mirror N10/N20 ratio is $$R_M = \frac{I_{o1}}{I_{in}} = \frac{L10 \times W20}{W10 \times L20},$$

wherein W10 is the width and L20 is the length of the input transistor N10, W20 is the width and L20 is the length of the output transistor N20 and $I_{IN}$ is the input current and $I_{o1}$ is the output current of the current mirror N10/N20.

For technological reasons the length of the transistors in current mirrors is usually kept the same so only the width of the transistors has to be considered now. The relative width of the transistors N10, N11, N20, and N21 of the NMOS current mirror configuration and the relative width of the transistors P10, P11, P20, and P21 of the PMOS current mirror configuration is also shown in FIG. 5. Transistor N11 has the width of $$W_{N11} = (2^{2^j} - 1) \times W_{N10},$$

wherein $W_{N11}$ is the width of transistor N11, $W_{N10}$ is the width of transistor N10, and index j corresponds to the position of the related bit of the exponent, namely in the case of transistor N11 j corresponds to the LSB bit of the exponent having the position −2 as described above. This means transistor N11 has the width $$W_{N11} = (2^{0.25} - 1) \times W_{N10}.$$

Accordingly transistor N21 has the width of $$W_{N21} = (2^{2^j} - 1) \times W_{N20},$$

wherein $W_{N21}$ is the width of transistor N21, $W_{N20}$ is the width of transistor N20, and the index j corresponds to the position of the related bit of the exponent, namely in the case of transistor N21 j corresponds to the second bit from the right having the position −1 as described above. This means transistor N11 has the width $$W_{N11} = (2^{0.5} - 1) \times W_{N10}.$$

In the preferred embodiment described transistor N20 has a relative width of 1 and transistor N10 has a relative width $W_{N10} = 2^{−0.25}$. Other relationships of the width of transistors N10, and N20 are possible as well to provide a scaling of the output current. But the relationships of the pairs (N10, N11) and (N20, N21) have to accord to the formulas above.

By switching N12 and/or N22 ON and OFF the width of N10 and N20 will be changed and accordingly the ratio of the current mirror N10/N20 will be changed.

In case transistor N12 is switched on by the LSB bit $e_{−2}$ and transistor N21 is still switched off, the width of the input transistor N10 of the current mirror N10/N20 will be increased and the output current will be reduced by the factor $2^{−0.25}$.

In case transistor N22 is switched on by the LSB bit $e_{−1}$ the width of the output transistor N20 of the current mirror N10/N20 will be increased and the output current will be increased by the factor $2^{0.5}$.

Following is a table of the ratio of the N10/N20 current mirror as a function of the bits $e_{−1}$ and $e_{−2}$ of the exponent of the incoming floating point number

| $e_{−1}$ | $e_{−2}$ | current mirror ratio |
| --- | --- | --- |
| 0 | 0 | 1 |
| 0 | 1 | $\frac{2^{0.5}}{2^{0.25}} \approx 1.19$ |
| 1 | 0 | $2^{0.5} \approx 1.41$ |
| 1 | 1 | $2^{0.5} 2^{0.25} \approx 1.68$ |

The current mirror P10/P20 operates principally the same way as the current mirror N10/N20 described above. The bit $e_0$ can switch OFF transistor P12 and thus decreases the width of the input transistor P10 of the current mirror P10/P20. The inverted bit $e_1$ can switch OFF transistor P22 and thus decreases the width of the output transistor P20 of the current mirror P10/P20. As shown in FIG. 5 the signal of bit $e_1$ is inverted.

Following is a table of the ratio of the P10/P20 current mirror as a function of the bits $e_0$ and the inverted bit $e_{1inv}$ of the exponent of the incoming floating point number

| $e_1$ | $e_0$ | current mirror ratio |
| --- | --- | --- |
| 0 | 0 | 1 |
| 0 | 1 | 2 |
| 1 | 0 | 4 |
| 1 | 1 | 8 |

The output current $I_1$ of the 4 bit exponential current digital-to-analog converter 50 of the present invention shown in FIG. 5 is $I_n$ times the product of the current mirror ratios of both N10/N20 and P10/P20 mirrors.

It is obvious that in the circuit of FIG. 5 the NMOS transistors N10 to N12 and N20 to N22 could be replaced by PMOS transistors while concurrently replacing accordingly the PMOS transistors P10 to P12 and P20 to P22 by NMOS transistors. All inputs $e_i$ would have to be inverted.

It has to be understood that the 4-bit exponential digital-to-analog converter is an example of the present invention. More or less bits are feasible by cascading more stages (or current mirrors) or omitting some stages. The ratios of the current mirrors must be of the form $2^{2^i}$, wherein i is an integer number.

Therefore the width of the switchable transistors (like N11, N21, P11, and P21) of the current mirrors to increase the width of the correspondent transistor of the current mirror has to be $2^{2^i} - 1$ related to the width of the correspondent transistor of a current mirror, wherein i is the index of the according bit of the input exponent vector.

In case of an exponent having n-bits the required number $N_{ST}$ of stages, or in other words current mirrors corresponds to the integer number of the division:

$$N_{ST} = int\left(\frac{n+1}{2}\right).$$

As described above for each bit of the exponent a transistor switch and a transistor, which is in parallel to an input or output transistor of a current mirror is required. Said transistor switch can switch ON the transistor being parallel to a current mirror transistor to increase the width of said current mirror transistor and thus to modify the ratio of this current mirror. The current mirrors are deployed using by turns NMOS and PMOS technology for each stage.

In case of an exponent having an odd number of bits one switching transistor and the related extension transistor is omitted. In case of an exponent having an odd number of bits there are two alternatives possible. In a first alternative transistor switch N12 and its correspondent mirror extension transistor N11 will be omitted and transistors N20 and N10 will have a same size.

Another alternative is to omit the current switch N22 and the correspondent current extension transistor N21.

As shown already in FIG. 3 the output current $I_1$ of the exponential digital-to-analog converter 50, as shown also in FIG. 5, is fed into a standard linear current digital-to-analog converter 32 which is converting the mantissa of the incoming digital floating point number. This linear current digital-to-analog converter 32 can be a low resolution DAC. The output current $I_1$ is biasing the linear current digital-to-analog converter 32. Therefore the output current I of the linear current digital-to-analog converter 32 is an analog signal directly correlated to the incoming digital floating-point number.

Alternatively, as described already in FIG. 4b, the sequence of the linear digital-to-analog converter and of the exponential digital-to-analog converter can be interchanged. This means that the output current of said standard linear digital-to-analog converter, which is converting the mantissa of the floating point number, is fed into the exponential current digital-to-analog converter, which is converting the exponent of the floating point number using the output current of the linear converter as biasing current.

Figure 6:
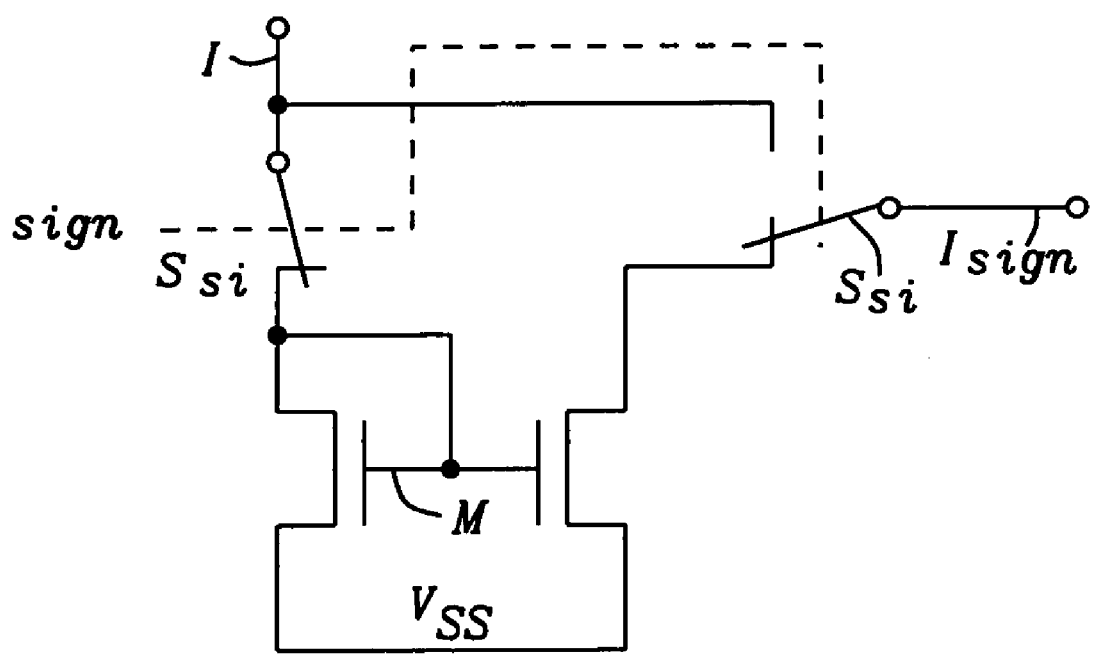
FIG. 6 illustrates a circuit diagram of a of a current direction switch block being able to convert the direction of the output current dependent on the sign of a floating point number to be converted.

In both embodiments described above the sign bit of the mantissa is not considered because it was not required by a related application. FIG. 6 illustrates how to consider the sign bit of an incoming floating-point number. Dependent upon the sign bit of the incoming floating point number the output current $I_{SIGN}$ is either sunk or sourced. Current I is the output current of the linear IDAC as shown in FIG. 3. Both switches $S_{SI}$ are controlled in parallel by the sign bit of the incoming floating point number. Dependent upon the position of the switches $S_{SI}$ the direction of the output current $I_{SIGN}$ remains unchanged compared to current I or the current I is directed through current mirror M and the output current $I_{SIGN}$ has a opposite direction compared to current I.

One key advantage of the present invention is that the floating point number is directly converted into an analog current and no digital floating-point to integer conversion is necessary. For an application with a high dynamic range and a medium accuracy the solution invented requires less chip area than a high resolution DAC, required in prior art.

While the invention has been particularly shown and described with reference to the preferred embodiments thereof, it will be understood by those skilled in the art that various changes in form and details may be made without departing from the spirit and scope of the invention.

What is claimed is:

1. A method to convert a digital floating point number directly into an analog signal is comprising:

provide a linear current digital-to-analog converter cascaded with an exponential current digital-to-analog converter;

split a floating-point number into its mantissa and exponent;

convert said exponent to a current representing an analog signal of the exponent using said exponential current digital-to-analog converter wherein the output current of said exponential current digital-to-analog converter corresponds to the equation:

$$I_1 = I_0 \times \prod_{j=\min}^{\max} 2^{2^j e_j},$$

wherein $I_1$ is the output current of the exponential digital-to-exponential converter, $I_0$ is a biasing current, $e_i \in \{0, 1\}$ represent the significant bit positions of the exponent wherein i is ranging from the MSB bit, signified by "max" to the LSB bit, signified by "min"; and convert said digital floating point number into an analog current by converting said mantissa by said linear current digital-to-analog converter using the output current of the previous step as biasing reference current.

2. The method of claim 1 wherein said analog signal of the exponent is a current.

3. The method of claim 1 wherein the direction of the output current indicates the sign of said floating-point number.

4. The method of claim 3 wherein said change of direction of the output current is provided by a current mirror and switches controlled by said sign.

5. The method of claim 1 wherein bits of said exponent are modifying the width of current mirror transistors within said exponential current digital-to-analog converter and thus amplifying or decreasing analog currents.

6. The method of claim 5 wherein the width of input and output transistors of said current mirrors is modified.

7. The method of claim 5 wherein said modification of the width of transistors is performed by activating or deactivating transistors arranged in parallel to said current mirror transistors.

8. The method of claim 7 wherein the widths of said transistors arranged in parallel to said current mirror transistors must follow the form $2^{2^j}-1$ related to the width of the transistors of the current mirror, wherein i is the index of the according bit of the vector of said exponent.

9. The method of claim 5 wherein said ratios of said current mirrors must follow the form $2^{2^j}$ wherein j is the index of the according bit of the vector of said exponent.

10. The method of claim 1 wherein the output current I of said a linear current digital-to-analog converter corresponds to the equation:

$$I = I_0 \times \prod_{j=\min}^{\max} 2^{2^j e_j} \times \sum_{i=0}^{n_m} 2^i m_i,$$

wherein $$I_0 \times \prod_{j=\min}^{\max} 2^{2^j e_j}$$

corresponds to the output current $I_1$ of said exponential current digital-to-analog converter, m represents the mantissa of the incoming digital floating point number 21, and $m_i \in \{0, 1\}$ represent the bit positions of the mantissa wherein i is ranging from a minimum position to the maximum $n_m$ position of the mantissa.

11. A method to convert a digital floating point number directly into an analog signal is comprising:

provide an exponential current digital-to-analog converter cascaded with a linear current digital-to-analog converter;

split a floating-point number into its mantissa and exponent;

convert said mantissa to a current representing an analog signal of the mantissa using said linear current digital-to-analog converter wherein the output current of said linear current digital-to-analog converter corresponds to the equation:

$$I_1 = I_0 \times \sum_{i=0}^{n_m} 2^i m_i,$$

wherein $I_1$ is the output current of said linear digital-to-exponential converter, $I_0$ is a biasing current, m represents the mantissa of the incoming digital floating point number, and $m_i \in \{0, 1\}$ represent the bit positions of the mantissa wherein i is ranging from a minimum position to the maximum $n_m$ position of the mantissa; and convert said digital floating point number into an analog current by converting said exponent by said exponential current digital-to-analog converter using the output current of the previous step as biasing reference current.

12. The method of claim 11 wherein said analog signal of the mantissa is a current.

13. The method of claim 11 wherein the direction of the output current indicates the sign of said floating-point number.

14. The method of claim 13 wherein said change of direction of the output current is provided by a current mirror and switches controlled by said sign.

15. The method of claim 11 wherein the output current I of said a exponential current digital-to-analog converter corresponds to the equation:

$$I = I_0 \times \sum_{i=0}^{n_m} 2^i m_i \times \prod_{j=\min}^{\max} 2^{2^j e_j},$$

wherein $$I_0 \times \sum_{i=0}^{n_m} 2^i m_i$$

corresponds to the output current $I_1$ of said linear current digital-to-analog converter, $e_j \in \{0, 1\}$ represent the significant bit positions of the exponent wherein i is ranging from the MSB bit, signified by "max" to the LSB bit, signified by "min".

16. The method of claim 11 wherein bits of said exponent are modifying the width of current mirror transistors within said exponential current digital-to-analog converter and thus amplifying or decreasing analog currents.

17. The method of claim 16 wherein the width of input and output transistors of said current mirrors is modified.

18. The method of claim 16 wherein said modification of the width of transistors is performed by activating or deactivating transistors arranged in parallel to said current mirror transistors.

19. The method of claim 18 wherein the widths of said transistors arranged in parallel to said current mirror transistors must follow the form $2^{2^j}-1$ related to the width of the transistors of the current mirror, wherein i is the index of the according bit of the vector of said exponent.

20. The method of claim 16 wherein said ratios of said current mirrors must follow the form $2^{2^j}$, wherein j is the index of the according bit of the vector of said exponent.

21. A circuit to convert digital floating point numbers into an analog current signal is comprising:

an exponential current digital-to-analog converter, having an input and an output, wherein the input is a vector comprising the bits of the exponent of said floating point number and the output is an analog current being correlated to the exponential value of said exponent wherein the output current of said exponential current digital-to-analog converter corresponds to the equation:

$$I_1 = I_0 \times \prod_{j=\min}^{\max} 2^{2^j e_j},$$

wherein $I_1$ is the output current of the exponential digital-to-exponential converter, $I_0$ is a biasing current, $e_i \in \{0, 1\}$ represent the significant bit positions of the exponent wherein i is ranging from the MSB bit, signified by "max" to the LSB bit, signified by "min";

a linear current digital-to analog converter having inputs and an output, wherein the inputs comprise a vector comprising the mantissa of said floating-point number and said analog output current of said exponential current digital-to-analog converter and the output comprises an analog current being linearly correlated to the value of said digital floating point number; and a means to convert the direction of the output current dependent upon the sign of said floating-point number.

22. The circuit of claim 21 wherein said linear current digital-to-analog converter is a low-resolution linear current digital-to-analog converter.

23. The circuit of claim 21 wherein the output current I of said a linear current digital-to-analog converter corresponds to the equation:

$$I = I_0 \times \prod_{j=\min}^{\max} 2^{2^j e_j} \times \sum_{i=0}^{n_m} 2^i m_i,$$

wherein $$I_0 \times \prod_{j=\min}^{\max} 2^{2^j e_j}$$

corresponds to the output current $I_1$ of said exponential current digital-to-analog converter, m represents the mantissa of the incoming digital floating point number 21, and $m_i \in \{0, 1\}$ represent the bit positions of the mantissa wherein i is ranging from a minimum position to the maximum $n_m$ position of the mantissa.

24. The circuit of claim 21 wherein said means to convert the direction of the output current comprises a means to mirror said output current and an arrangement of switches activated the sign of said floating-point number.

25. The circuit of claim 24 wherein said means to convert the direction of the output current is comprising:
- a first switch, controlled by said sign bit, wherein a first terminal of said switch is connected to said output of said linear converter and a second terminal is connected to an input transistor of a current mirror;
- said input transistor of said current mirror wherein the drain of said input transistor is connected to said second terminal of said first switch and to its gate, its source is connected to VSS voltage and its gate is connected to the gate of an output transistor of said current mirror;
- said output transistor of said current mirror wherein the drain of said output transistor is connected to a second terminal of a second switch and its source is connected to VSS voltage; and
- said second switch, controlled by said sign bit, switching between a first terminal being connected to said output of said linear converter and said second terminal, wherein its midpoint provides an output current of an direction controlled by said sign bit.

26. The circuit of claim 21 wherein said exponential current digital-to analog converter, being capable to convert n bits of an exponent of an incoming digital floating point number is comprising:
- a current source, providing a biasing current having two terminals, wherein a first terminal is connected to VDD voltage and a second terminal is connected to the drain of a first NMOS transistor switch, to the drain and to the gate of an NMOS input transistor of a first current mirror, to the gate of an NMOS output transistor of said first current mirror, to the gate of a second NMOS transistor being parallel to said input transistor of said first current mirror, and to the gate of a third NMOS transistor being parallel to said output transistor of said first current mirror;
- a number of stages, wherein said number of stages is correlated to the number of bits of said exponent and each stage is deployed by turns using NMOS and PMOS technology and each stage is comprising a current mirror, two transistors, wherein each of them is arranged in parallel to either the input or the output transistor of said current mirror, and two transistor switches, wherein one of said transistor switches is connected to one of said transistors arranged in parallel to one of said input or output transistors, wherein each of said transistor switches having their gates connected to one specific bit of said exponent and they are activating, upon the status of the related bit of said exponent, the corresponding transistor arranged in parallel of the input transistor, wherein the gate of a first transistor switch of the first current mirror is connected to the least significant bit of said exponent and each following transistor switch has its gate connected to the next bit of the exponent from right to left, wherein the sources of the NMOS current mirrors and of the related parallel transistors are connected to Vss voltage and their gates are all interconnected, wherein the sources of the PMOS current mirrors and of the related parallel transistors are connected to VDD voltage and their gates are all interconnected, wherein the output current of a current mirror is the input current of the current mirror of the following stage with the exception of the last stage, wherein its output current is the output of the exponential digital-to analog converter.

27. The circuit of claim 26 wherein in case of an odd number of bits of the exponent a second of said transistor switches and a second of said transistors arranged in parallel to one of said input or output transistors are being omitted.

28. The circuit of claim 26 wherein in case of an odd number of bits of the exponent a first of said transistor switches and a first of said transistors arranged in parallel to one of said input or output transistors are being omitted.

29. The circuit of claim 26 wherein said number of stages is defined by the equation $$NST = int\left(\frac{n+1}{2}\right),$$

wherein NST is the number of stages deployed and n is the number of bits of the exponent.

30. The circuit of claim 26 wherein the widths of said transistors arranged in parallel to said current mirror transistors must follow the form $2^{2^i}-1$ related to the width of the transistors of the current mirror, wherein i is the index of the according bit of the vector of said exponent.

31. The circuit of claim 26 wherein said ratios of said current mirrors must follow the form $2^{2^i}$, wherein i is the index of the according bit of the vector of said exponent.

32. A circuit to convert digital floating point numbers into an analog current signal is comprising:
- a linear current digital-to-analog converter, having an input and an output, wherein the input is a vector comprising the bits of the mantissa of said floating point number and the output is an analog current being correlated to the linear value of said mantissa;
- an exponential current digital-to analog converter having inputs and an output, wherein the inputs comprise a vector comprising the exponent of said floating-point number and said analog output current of said linear current digital-to-analog converter and the output comprises an analog current being linearly correlated to the value of said digital floating point number, wherein the output current I of said exponential current digital-to-analog converter corresponds to the equation:

$$I = I_0 \times \sum_{i=0}^{n_m} 2^i m_i \times \prod_{j=\min}^{\max} 2^{2^j e_j},$$

wherein $$I_0 \times \sum_{i=0}^{n_m} 2^i m_i$$

corresponds to the output current $I_1$ of said linear current digital-to-analog converter, m represents the mantissa of the incoming digital floating point number 21, $m_i \in \{0, 1\}$ represent the bit positions of the mantissa wherein i is ranging from a minimum position to the maximum $n_m$ position of the mantissa, $e_j \in \{0, 1\}$ represent the significant bit positions of the exponent wherein i is ranging from the MSB bit, signified by "max" to the LSB bit, signified by "min"; and a means to convert the direction of the output current dependent upon the sign of said floating-point number.

33. The circuit of claim 32 wherein said linear current digital-to-analog converter is a low-resolution linear current digital-to-analog converter.

34. The circuit of claim 32 wherein said means to convert the direction of the output current comprises a means to mirror said output current and an arrangement of switches activated the sign of said floating-point number.

35. The circuit of claim 34 wherein said means to convert the direction of the output current is comprising:

a first switch, controlled by said sign bit, wherein a first terminal of said switch is connected to said output of said linear converter and a second terminal is connected to an input transistor of a current mirror;

said input transistor of said current mirror wherein the drain of said input transistor is connected to said second terminal of said first switch and to its gate, its source is connected to VSS voltage and its gate is connected to the gate of an output transistor of said current mirror;

said output transistor of said current mirror wherein the drain of said output transistor is connected to a second terminal of a second switch and its source is connected to VSS voltage; and said second switch, controlled by said sign bit, switching between a first terminal being connected to said output of said linear converter and said second terminal, wherein its midpoint provides an output current of an direction controlled by said sign bit.

36. The circuit of claim 32 wherein said exponential current digital-to analog converter, being capable to convert n bits of an exponent of an incoming digital floating point number is comprising:

a current source, providing a biasing current having two terminals, wherein a first terminal is connected to VDD voltage and a second terminal is connected to the drain of a first NMOS transistor switch, to the drain and to the gate of an NMOS input transistor of a first current mirror, to the gate of an NMOS output transistor of said first current mirror, to the gate of a second NMOS transistor being parallel to said input transistor of said first current mirror, and to the gate of a third NMOS transistor being parallel to said output transistor of said first current mirror;

a number of stages, wherein said number of stages is correlated to the number of bits of said exponent and each stage is deployed by turns using NMOS and PMOS technology and each stage is comprising a current mirror, two transistors, wherein each of them is arranged in parallel to either the input or the output transistor of said current mirror, and two transistor switches, wherein one of said transistor switches is connected to one of said transistors arranged in parallel to one of said input or output transistors, wherein each of said transistor switches having their gates connected to one specific bit of said exponent and they are activating, upon the status of the related bit of said exponent, the corresponding transistor arranged in parallel of the input transistor, wherein the gate of a first transistor switch of the first current mirror is connected to the least significant bit of said exponent and each following transistor switch has its gate connected to the next bit of the exponent from right to left, wherein the sources of the NMOS current mirrors and of the related parallel transistors are connected to Vss voltage and their gates are all interconnected, wherein the sources of the PMOS current mirrors and of the related parallel transistors are connected to VDD voltage and their gates are all interconnected, wherein the output current of a current mirror is the input current of the current mirror of the following stage with the exception of the last stage, wherein its output current is the output of the exponential digital-to analog converter.

37. The circuit of claim 36 wherein in case of an odd number of bits of the exponent a second of said transistor switches and a second of said transistors arranged in parallel to one of said input or output transistors are being omitted.

38. The circuit of claim 36 wherein in case of an odd number of bits of the exponent a first of said transistor switches and a first of said transistors arranged in parallel to one of said input or output transistors are being omitted.

39. The circuit of claim 36 wherein said number of stages is defined by the equation $$NST = int\left(\frac{n+1}{2}\right),$$

wherein NST is the number of stages deployed and n is the number of bits of the exponent.

40. The circuit of claim 36 wherein the widths of said transistors arranged in parallel to said current mirror transistors must follow the form $2^{2^j}-1$ related to the width of the transistors of the current mirror, wherein i is the index of the according bit of the vector of said exponent.

41. The circuit of claim 36 wherein said ratios of said current mirrors must follow the form $2^{2^j}$, wherein i is the index of the according bit of the vector of said exponent.

* * * * *